(12) United States Patent
Lu et al.

(10) Patent No.: US 12,238,876 B2
(45) Date of Patent: Feb. 25, 2025

(54) SIZE-ADJUSTABLE STRUCTURE FOR MOUNTING AND PROTECTING ELECTRONIC DEVICE AND TANK

(71) Applicant: Fulian Precision Electronics (Tianjin) Co., LTD., Tianjin (CN)

(72) Inventors: Jian-Fa Lu, Neihu (TW); Yen-Lu Cheng, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 229 days.

(21) Appl. No.: 18/070,317

(22) Filed: Nov. 28, 2022

(65) Prior Publication Data

US 2023/0189455 A1   Jun. 15, 2023

(30) Foreign Application Priority Data

Dec. 15, 2021   (CN) .......................... 202111539944.2

(51) Int. Cl.
H05K 5/02 (2006.01)
(52) U.S. Cl.
CPC ...................................... H05K 5/02 (2013.01)
(58) Field of Classification Search
CPC ........................................................ H05K 5/02
USPC ..................................................... 312/223.2
See application file for complete search history.

(56) References Cited

U.S. PATENT DOCUMENTS

| 5,941,621 A * | 8/1999 | Boulay ................ H05K 7/1421 |
| | | 312/334.4 |
| 10,881,020 B1 * | 12/2020 | Liu ..................... H05K 7/20318 |
| 11,032,943 B2 * | 6/2021 | Li ......................... H05K 7/2039 |
| 12,004,321 B2 * | 6/2024 | Moon ................ H05K 7/20236 |
| 2002/0190011 A1 * | 12/2002 | Caporale ............... H05K 7/183 |
| | | 361/679.02 |
| 2014/0301037 A1 * | 10/2014 | Best .................... H05K 7/20781 |
| | | 29/857 |
| 2018/0084671 A1 * | 3/2018 | Matsumoto ........ H05K 7/20772 |
| 2022/0361366 A1 * | 11/2022 | Hsieh ................ H05K 7/20236 |
| 2024/0090170 A1 * | 3/2024 | Chen ................. H05K 7/20327 |
| 2024/0251524 A1 * | 7/2024 | Liu .................... H05K 7/20272 |

FOREIGN PATENT DOCUMENTS

| CN | 213987382 | 8/2021 |
| TW | 070156 | 9/1985 |
| TW | 588924 | 5/2004 |

* cited by examiner

*Primary Examiner* — Janet M Wilkens
*Assistant Examiner* — Timothy M Ayres
(74) *Attorney, Agent, or Firm* — ScienBiziP, P.C.

(57) ABSTRACT

A structure for securely mounting and protecting electronic devices within a housing or tank includes two supporting plates connected to two mounting pieces. The supporting plate defines a first hole, and the mounting piece defines a second hole. A fastener through the first hole and the second hole will position and hold the mounting piece on the supporting plate. The two mounting pieces position the electronic device. The mounting pieces are adjustable relative to the supporting plate, so the distance between two mounting pieces is fully adjustable to fit and hold electronic devices of different sizes. A tank or housing using the structure is also disclosed.

14 Claims, 8 Drawing Sheets

SIZE-ADJUSTABLE STRUCTURE FOR MOUNTING AND PROTECTING ELECTRONIC DEVICE AND TANK

FIELD

The subject matter herein generally relates to placement and support of electronic devices, and to a structure for mounting and protecting electronic device within a tank.

BACKGROUND

Electronic devices may be mounted in a tank or housing for protection. However, structure for mounting electronic device in the tank may not be adjustable for size, resulting in low positioning accuracy and a risk of electronic devices being mounted in an unstable manner or causing damages to the electronic devices.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
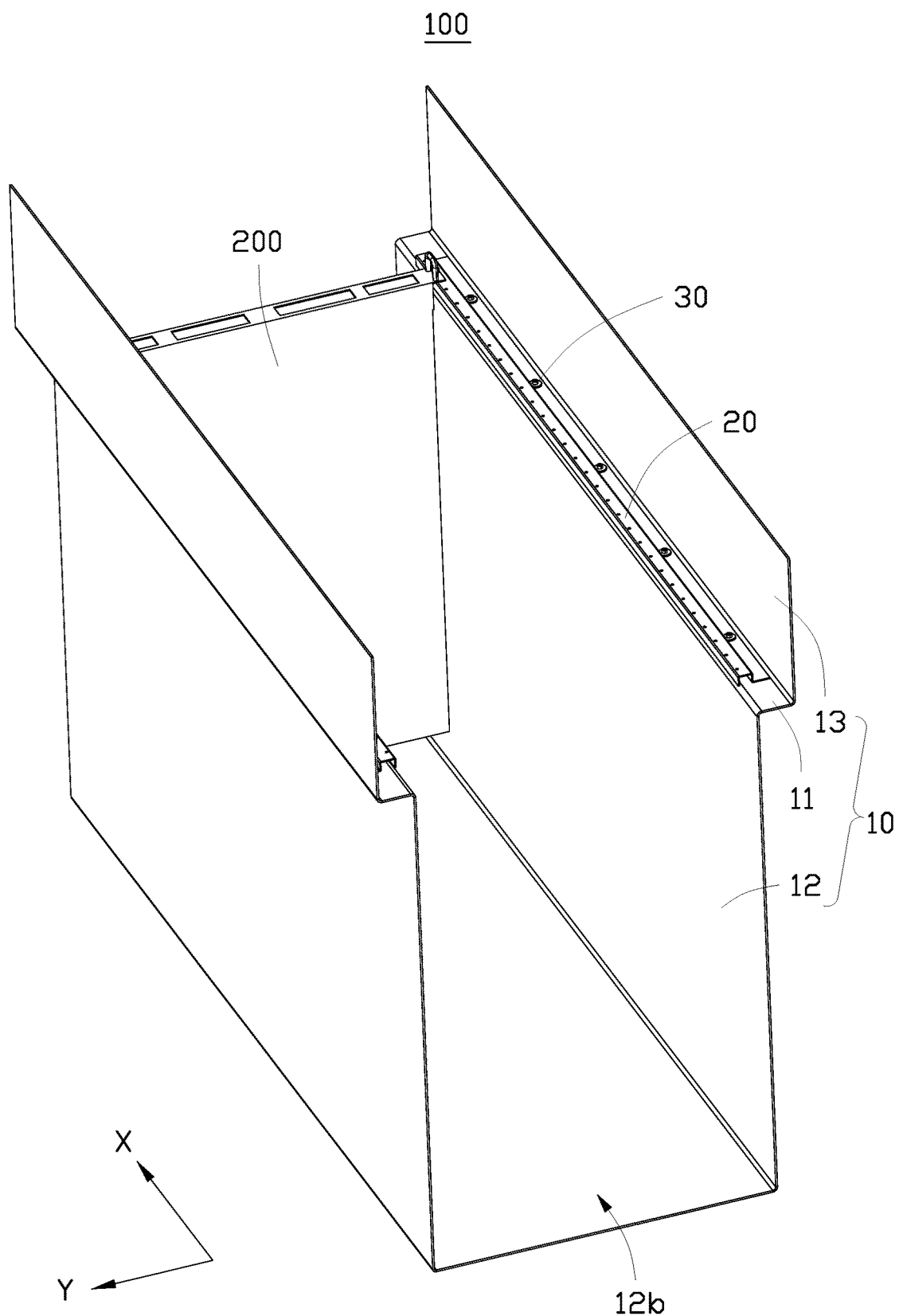
FIG. 1 is an isometric view of a mounting structure configured for mounting and protecting electronic device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
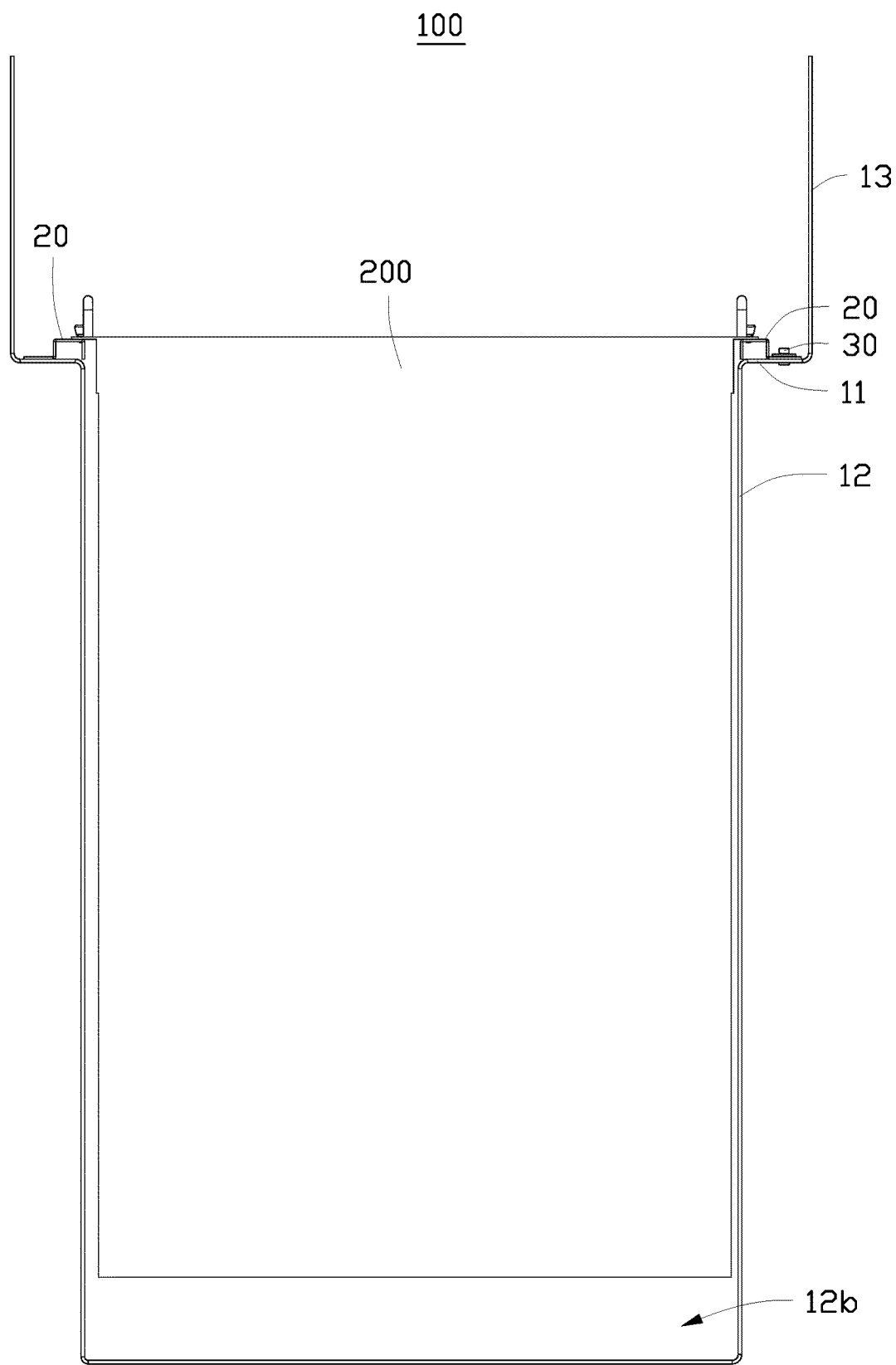
FIG. 2 is a front view of the mounting structure holding an electronic device according to an embodiment of the present disclosure.
Figure 3:
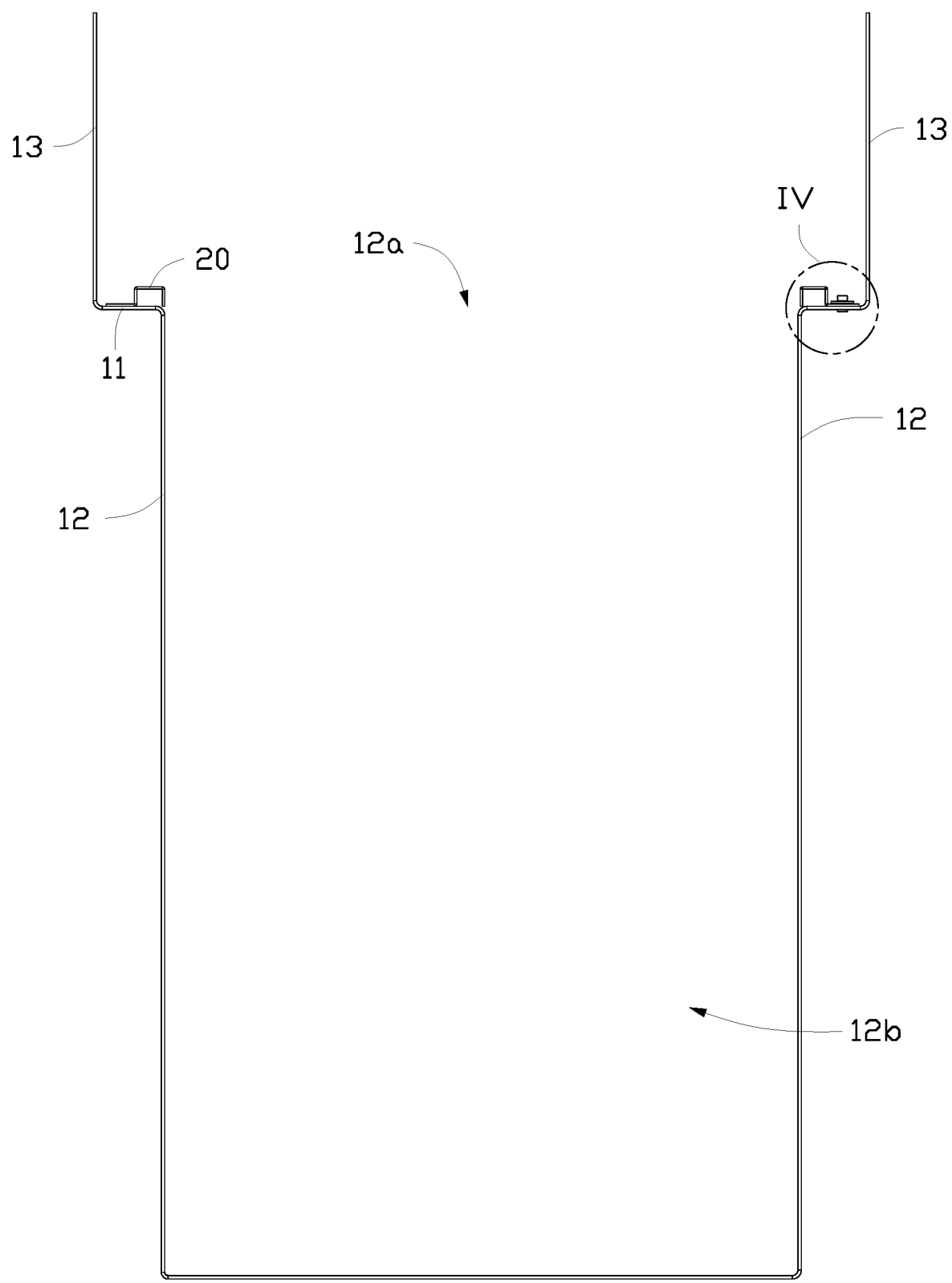
FIG. 3 is another front view of the mounting structure according to an embodiment of the present disclosure.

As shown in FIG. 1 to FIG. 3, a mounting structure 100 for mounting and protecting electronic device in one embodiment includes a base 10 and two mounting pieces 20. The base 10 includes two supporting plates 11. The two supporting plates 11 are located on the same horizontal plane. Each of the two supporting plates 11 extends lengthways in the housing (direction X). The two supporting plates 11 are arranged widthways in the housing (direction Y), direction Y is substantially perpendicular to direction X. The two supporting plates 11 form a containing space 12b to contain and hold electronic devices 200. Each of the two mounting pieces 20 extends in direction X. The two mounting pieces 20 are connected to the two supporting plates 11. The two mounting pieces 20 are configured to position and securely hold electronic devices 200 on two sides.

Figure 6:
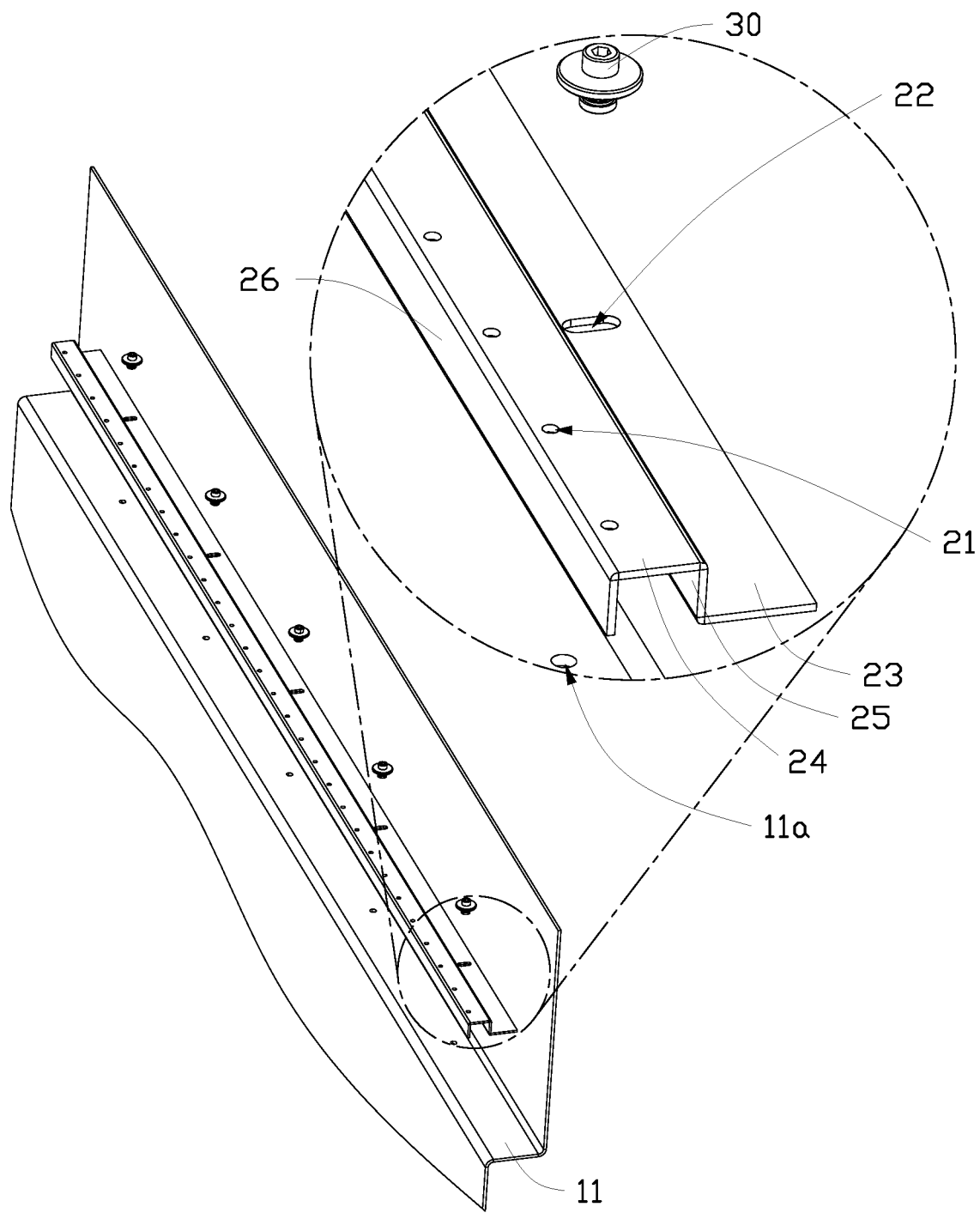
FIG. 6 is an exploded view of the supporting plate and the mounting piece according to an embodiment of the present disclosure.

As shown in FIG. 6, at least one of the two supporting plates 11 defines a first hole 11a. At least one of the two mounting pieces 20 defines a second hole 22. The second hole 22 extends along direction Y. The first hole 11a is circular. The mounting structure 100 further comprises a fastener 30. Upon insertion into the first hole 11a and the second hole 22, the fastener 30 positions and secures the mounting piece 20 to the supporting plate 11. The mounting piece 20 is movable along direction Y relative to the supporting plate 11, so the distance between the two mounting pieces 20 can be adjusted to fit electronic devices 200 of different sizes.

In some embodiments, the two mounting pieces 20 define a second hole 22, and the two supporting plates 11 define a first hole 11a. In other embodiments, a second hole 22 is defined in only one of the two mounting pieces 20, and a first hole 11a is defined in only one of the two supporting plates 11. The other one of the two mounting pieces 20 can then be fixed on the other supporting plate 11.

Each of the two mounting pieces 20 defines a third hole 21. There are two third holes 21 in a mounting piece 20 for the fastener 30 to position and secure one electronic device 200.

In some embodiments, the fastener 30 is a screw.

In some embodiments, the electronic device 200 may be, for example, hard drive, processor, storage device, etc.

In some embodiments, a number of first holes 11a are arranged on one supporting plate 11 in direction X. A number of second holes 22 are arranged on one mounting piece 20 in direction X. The first holes 11a correspond one-to-one with the second holes 22. A number of third holes 21 are arranged on each mounting piece 20 in direction X. Each pair of third holes 21 of the two mounting pieces 20 are aligned in direction Y, widthways across the housing.

Figure 4:
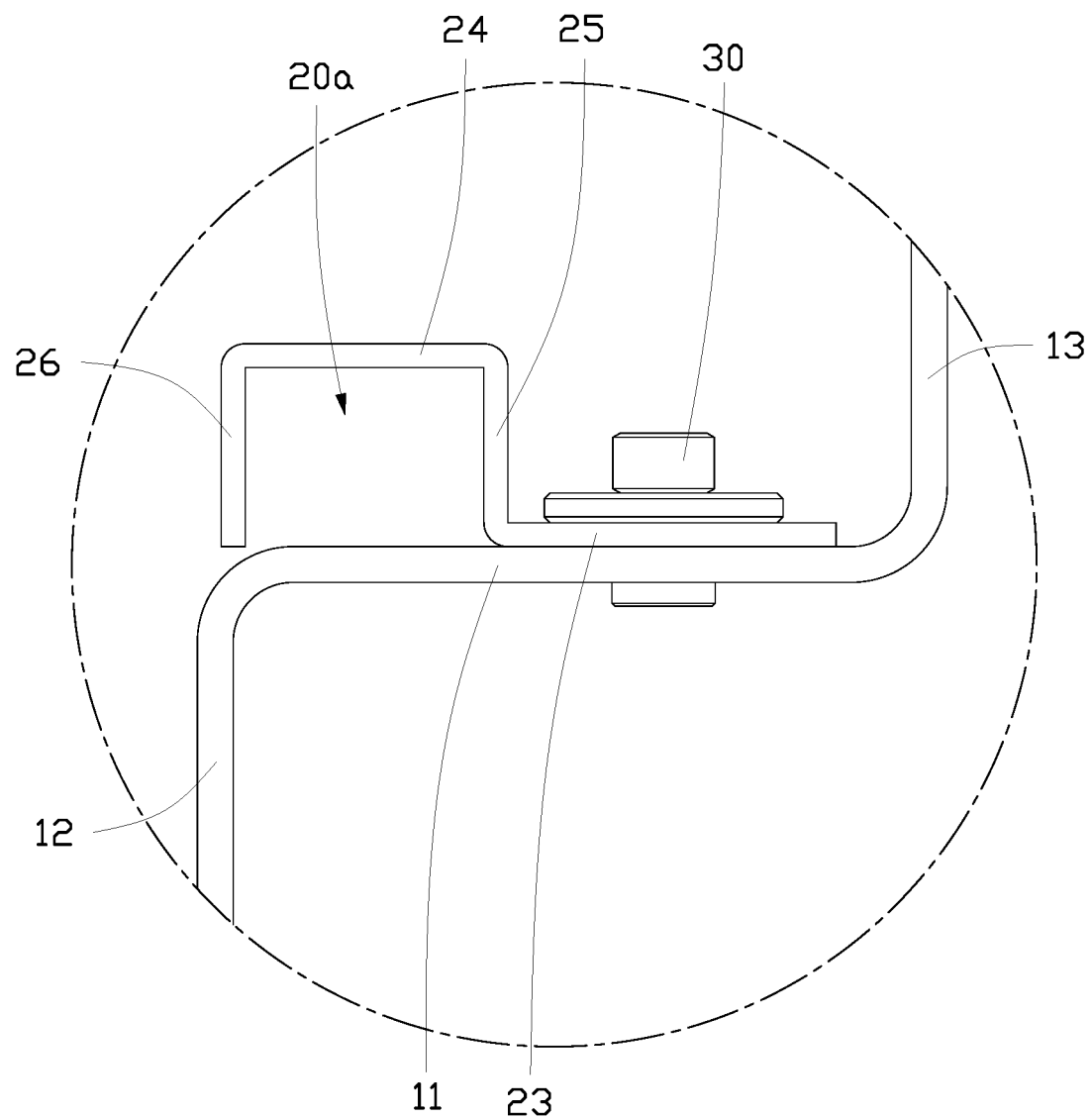
FIG. 4 is an enlarged view of area IV in FIG. 3.

In some embodiments, as shown in FIG. 4, each mounting piece 20 includes a first sheet 23 and a second sheet 24. The first sheet 23 is parallel to the second sheet 24. The first sheet 23 and the second sheet 24 extend along direction X. The second holes 22 are defined on the first sheet 23. The first sheet 23 is connected to the supporting plate 11. The third holes 21 are defined on the second sheet 24. The second sheet 24 functions to position the electronic device 200. The second sheet 24 is located above the supporting plate 11 and the first sheet 23, so a gap 20a is defined between the second sheet 24 and the supporting plate 11. The gap 20a provides space for installing the fastener 30.

Each of the two mounting pieces 20 further comprises a third sheet 25. The third sheet 25 is connected between the first sheet 23 and the second sheet 24. The third sheet 25 is substantially perpendicular to the first sheet 23 and the second sheet 24. The first sheet 23 and the second sheet 24 are located on opposite sides of the third sheet 25 in direction Y. The second sheet 24 is located between the containing space 12b and the first sheet 23.

Each of the two mounting pieces 20 further comprises a fourth sheet 26. The fourth sheet 26 is connected to the side of the second sheet 24 away from the first sheet 23. The fourth sheet 26 is substantially perpendicular to the second sheet 24. The fourth sheet 26 forms a barrier between the gap 20a and the containing space 12b, preventing entry of debris into the gap 20a.

Figure 5:
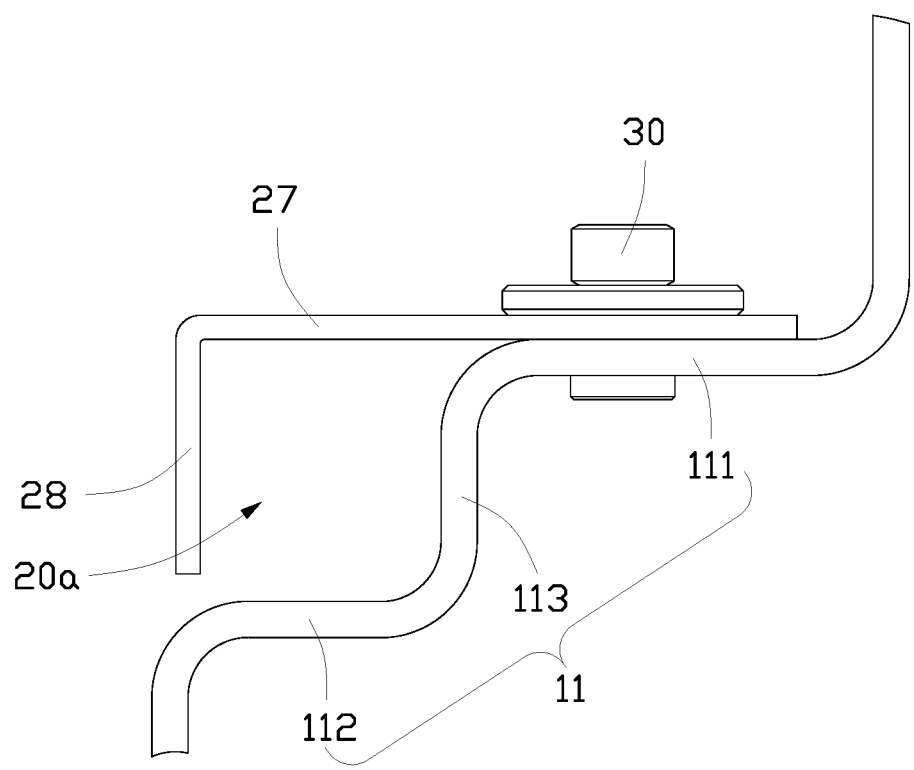
FIG. 5 is an enlarged view of a structure of a supporting plate and a mounting piece according to an embodiment of the present disclosure.

In another example, shown as FIG. 5, each mounting piece 20 comprises a fifth sheet 27 and a ninth sheet 28. Each supporting plate 11 comprises sixth, seventh, and eighth sheets 111, 112, and 113. The first holes 11a are defined on the sixth sheet 111. The second holes 22 and the third holes 21 are defined on the fifth sheet 27. The fifth sheet 27 is connected to the sixth sheet 111 and positions the electronic device 200. The seventh sheet 112 is parallel to the sixth sheet 111 and is located between the containing space 12b and the sixth sheet 111. The seventh sheet 112 is located below the sixth sheet 111. There is a gap 20a defined between the fifth sheet 27 and the seventh sheet 112, the gap 20a allows space for installing the fastener 30.

The eighth sheet 113, between the sixth sheet 111 and the seventh sheet 112, is substantially perpendicular to and forms a step with the sixth and seventh sheets 111 and 112.

The ninth sheet 28 is connected to the side of the fifth sheet 27 close to the containing space 12b. The ninth sheet 28 separates the gap 20a from the containing space 12b, also preventing entry of debris into the gap 20a.

As shown in FIG. 1 to FIG. 3, in some embodiments, the base 10 further includes a bottom plate 12. The bottom plate 12 is U-shaped. The bottom plate 12 is connected between the two supporting plates 11 and is located below the two supporting plates 11. The containing space 12b is formed between the bottom plates 12. An opening 12a is defined at the top of the bottom plate 12. The opening 12a is connected to the containing space 12b for installing electronic devices 200.

The base 10 further includes two connecting walls 13. The two connecting walls 13 are connected to the two supporting plates 11. The two connecting walls 13 can connect to other structures.

Figure 7:
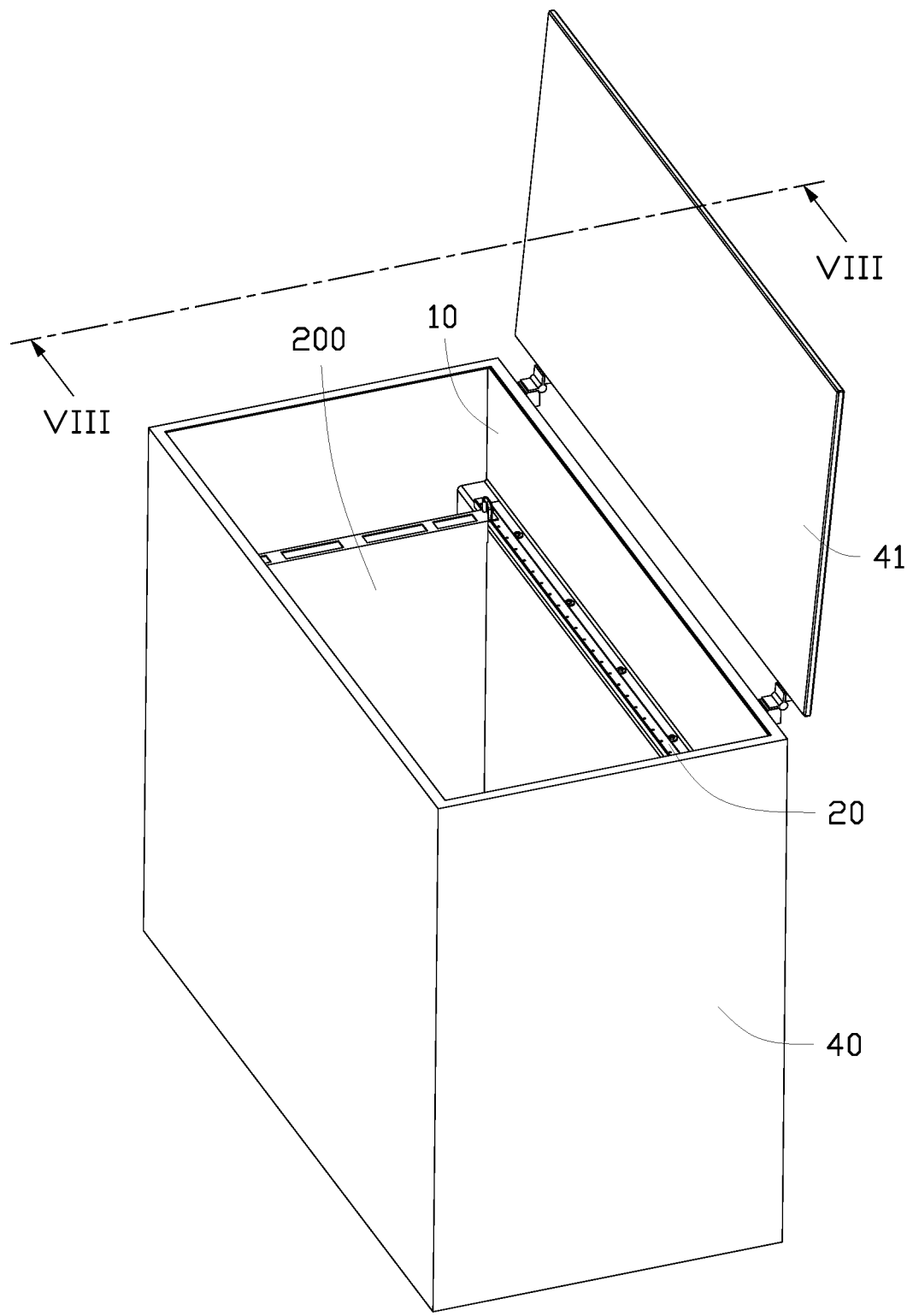
FIG. 7 is an isometric view of a tank or a housing according to an embodiment of the present disclosure.
Figure 8:
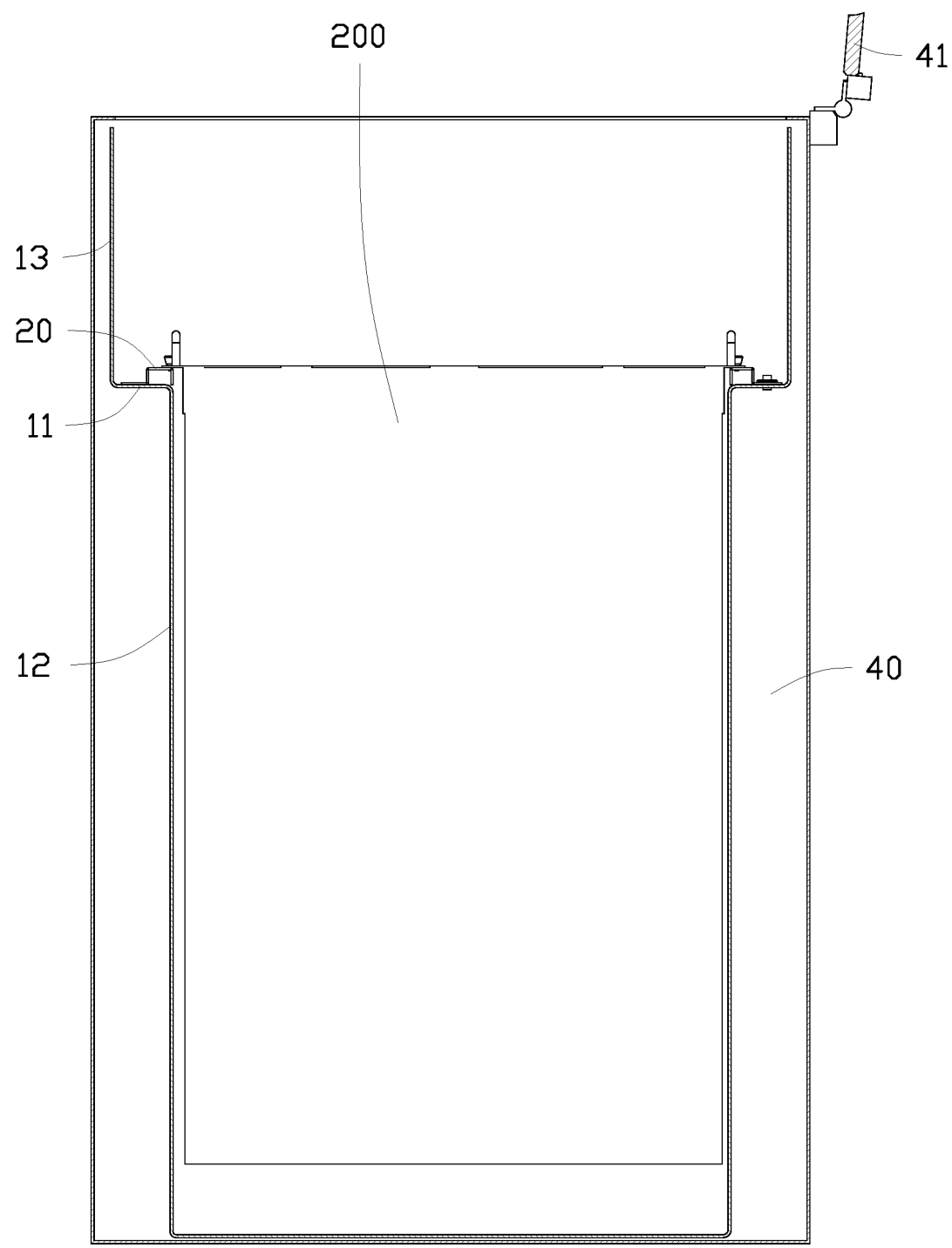
FIG. 8 is a section view along line VIII-VIII in FIG. 7.

As shown in FIG. 7 and FIG. 8, a tank 300 of an embodiment includes a box 40 with a lid 41, to hold the structures 100 and a plurality of electronic devices 200. The structures 100 can be positioned in the box 40. The two connecting walls 13 are connected to the box 40. The tank 300 will securely hold and protect electronic devices 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A mounting structure configured for protecting an electronic device, the mounting structure comprising:
   a base comprising two supporting plates;
   two mounting pieces connecting to the two supporting plates, respectively; and
   a fastener;
   wherein each of the two supporting plates extends in a first direction, the two supporting plates are arranged in a second direction, the second direction is substantially perpendicular to the first direction, a containing space is defined between the two supporting plates, the containing space is configured for containing an electronic device, at least one of the two supporting plates defines a first hole, at least one of the two mounting pieces defines a second hole, the second hole extends in the second direction, a relative position between the mounting piece and the respective supporting plate is adjustable in the second direction, the fastener is insertable into the first hole and the second hole to position the mounting piece relative to the supporting plate, each of the two mounting pieces defines at least one third hole, the third holes and the fastener are configured for positioning the electronic device;
   each of the two mounting pieces extends in the first direction, a plurality of the first holes are defined in the first direction on at least one of the two supporting plates, a plurality of the second holes are defined in the first direction on at least one of the two mounting pieces, the plurality of first holes correspond one-to-one with the plurality of second holes, a plurality of the third holes are in the first direction on each of the two mounting pieces, the third holes of the two respective mounting pieces are paired and aligned in the second direction;
   each of the two mounting pieces comprises a fifth sheet, each of the two supporting plates comprises a sixth sheet and a seventh sheet, the plurality of first holes are defined on the sixth sheet, the plurality of second holes and the third holes are defined on the fifth sheet, the fifth sheet is connected to the sixth sheet and is configured for supporting the electronic device, the seventh sheet is parallel to the sixth sheet and is located between the containing space and the sixth sheet, the seventh sheet is located below the sixth sheet, a gap is defined between the fifth sheet and the seventh sheet, the gap is configured for containing the fastener;
   each of the two supporting plates further comprises an eighth sheet, a portion of the eighth sheet between the sixth sheet and the seventh sheet is substantially perpendicular to and forms a step with the sixth and the seventh sheets.

2. The mounting structure of claim 1, wherein:
   each of the two mounting pieces comprises a first sheet and a second sheet, the first sheet is parallel to the second sheet, each of the first sheet and the second sheet extends in the first direction, the plurality of second holes are defined on the first sheet, the first sheet is connected to the supporting plate, the third holes are defined on the second sheet, the second sheet is configured for supporting the electronic device, the second sheet is located above the supporting plate, a gap is defined between the second sheet and the supporting plate, the gap is configured for containing the fastener.

3. The mounting structure of claim 2, wherein:
each of the two mounting pieces further comprises a third sheet, the third sheet is connected between the first sheet and the second sheet, the first sheet and the second sheet are located on opposite sides of the third sheet in the second direction, and the second sheet is located between the containing space and the first sheet.

4. The mounting structure of claim 3, wherein:
each of the two mounting pieces further comprises a fourth sheet, the fourth sheet is connected to a side of the second sheet away from the first sheet, the fourth sheet is configured to form a barrier between the gap and the containing space.

5. The mounting structure of claim 4, wherein:
the third sheet and the fourth sheet are substantially perpendicular to the second sheet.

6. The mounting structure of claim 1, wherein:
the base further comprises a bottom plate, the bottom plate is U-shaped, the bottom plate is connected between the two supporting plates and is located below the two supporting plates, the containing space is formed in the bottom plate, an opening is defined at the top of the bottom plate, the opening communicates to the containing space.

7. The mounting structure of claim 1, wherein:
each of the two mounting pieces further comprises a ninth sheet, the ninth sheet is connected to a side of the fifth sheet close to the containing space, the ninth sheet is configured to separate the gap and the containing space.

8. A tank comprising:
a box with a lid; and
a mounting structure configured for protecting electronic device in the box;
wherein the mounting structure comprises:
a base comprising two supporting plates;
two mounting pieces connecting to the two supporting plates, respectively; and
a fastener;
wherein each of the two supporting plates extends in a first direction, the two supporting plates are arranged in a second direction, the second direction is substantially perpendicular to the first direction, a containing space is defined between the two supporting plates, the containing space is configured for containing an electronic device, at least one of the two supporting plates defines a first hole, at least one of the two mounting pieces defines a second hole, the second hole extends in the second direction, a relative position between the mounting piece and the respective supporting plate is adjustable in the second direction, the fastener is insertable into the first hole and the second hole to position the mounting piece relative to the supporting plate, each of the two mounting pieces defines at least one third hole, the third holes and the fastener are configured for positioning the electronic device;
each of the two mounting pieces extends in the first direction, a plurality of the first holes are defined in the first direction on at least one of the two supporting plates, a plurality of the second holes are defined in the first direction on at least one of the two mounting pieces, the plurality of first holes correspond one-to-one with the plurality of second holes, a plurality of the third holes are in the first direction on each of the two mounting pieces, the third holes of the two respective mounting pieces are paired and aligned in the second direction;
each of the two mounting pieces comprises a fifth sheet, each of the two supporting plates comprises a sixth sheet and a seventh sheet, the plurality of first holes are defined on the sixth sheet, the plurality of second holes and the third holes are defined on the fifth sheet, the fifth sheet is connected to the sixth sheet and is configured for supporting the electronic device, the seventh sheet is parallel to the sixth sheet and is located between the containing space and the sixth sheet, the seventh sheet is located below the sixth sheet, a gap is defined between the fifth sheet and the seventh sheet, the gap is configured for containing the fastener;
each of the two supporting plates further comprises an eighth sheet, a portion of the eighth sheet between the sixth sheet and the seventh sheet is substantially perpendicular to and forms a step with the sixth and the seventh sheets;
each of the two mounting pieces further comprises a ninth sheet, the ninth sheet is connected to a side of the fifth sheet close to the containing space, the ninth sheet is configured to separate the gap and the containing space.

9. The tank of claim 8, wherein:
each of the two mounting pieces comprises a first sheet and a second sheet, the first sheet is parallel to the second sheet, each of the first sheet and the second sheet extends in the first direction, the plurality of second holes are defined on the first sheet, the first sheet is connected to the supporting plate, the third holes are defined on the second sheet, the second sheet is configured for supporting the electronic device, the second sheet is located above the supporting plate, a gap is defined between the second sheet and the supporting plate, the gap is configured for containing the fastener.

10. The tank of claim 9, wherein:
each of the two mounting pieces further comprises a third sheet, the third sheet is connected between the first sheet and the second sheet, the first sheet and the second sheet are located on opposite sides of the third sheet in the second direction, and the second sheet is located between the containing space and the first sheet.

11. The tank of claim 10, wherein:
each of the two mounting pieces further comprises a fourth sheet, the fourth sheet is connected to a side of the second sheet away from the first sheet, the fourth sheet is configured to form a barrier between the gap and the containing space.

12. The tank of claim 11, wherein:
the third sheet and the fourth sheet are substantially perpendicular to the second sheet.

13. The tank of claim 8, wherein:
the base further comprises a bottom plate, the bottom plate is U-shaped, the bottom plate is connected between the two supporting plates and is located below the two supporting plates, the containing space is formed in the bottom plate, an opening is defined at the top of the bottom plate, the opening communicates to the containing space.

14. The tank of claim 8, wherein:
the base further comprises two connecting walls, the two connecting walls are connected to the two supporting plates, respectively, the two connecting walls are configured to connect the box.

* * * * *